United States Patent
Dalmia

(10) Patent No.: US 6,683,930 B1
(45) Date of Patent: *Jan. 27, 2004

(54) DIGITAL PHASE/FREQUENCY DETECTOR, AND CLOCK GENERATOR AND DATA RECOVERY PLL CONTAINING THE SAME

(75) Inventor: Kamal Dalmia, Austin, TX (US)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/470,665

(22) Filed: Dec. 23, 1999

(51) Int. Cl.⁷ ................................................ H03D 3/24
(52) U.S. Cl. ...................................... 375/376; 375/373
(58) Field of Search ................... 331/11–25; 327/1–503

(56) References Cited

U.S. PATENT DOCUMENTS

| | | | |
|---|---|---|---|
| 4,593,254 A | 6/1986 | Coburn | 331/1 A |
| 4,594,564 A | 6/1986 | Yarborough, Jr. | 331/1 A |
| 4,926,447 A * | 5/1990 | Corsetto et al. | 375/376 |
| 4,940,952 A | 7/1990 | Kegasa | 331/11 |
| 4,943,788 A | 7/1990 | Laws et al. | 331/11 |
| 5,506,875 A | 4/1996 | Nuckolls et al. | 375/375 |
| 5,550,878 A * | 8/1996 | Shigaki et al. | 375/373 |
| 5,574,756 A | 11/1996 | Jeong | 375/376 |
| 5,694,088 A | 12/1997 | Dickson | 331/12 |
| 5,712,580 A | 1/1998 | Baumgartner et al. | 327/12 |
| 5,719,908 A * | 2/1998 | Greeff et al. | 375/376 |
| 5,739,709 A * | 4/1998 | Banno | 327/156 |
| 5,799,048 A | 8/1998 | Farjad-Rad et al. | 375/360 |
| 5,838,749 A * | 11/1998 | Casper et al. | 375/376 |
| 5,910,753 A * | 6/1999 | Bogdan | 331/17 |
| 5,950,115 A * | 9/1999 | Momtaz et al. | 455/73 |
| 5,953,386 A | 9/1999 | Anderson | 375/376 |
| 6,041,090 A | 3/2000 | Chen | 375/376 |
| 6,055,286 A | 4/2000 | Wu et al. | 375/375 |
| 6,075,416 A | 6/2000 | Dalmia | 331/25 |
| 6,081,572 A * | 6/2000 | Filip | 375/376 |
| 6,215,835 B1 * | 4/2001 | Kyles | 375/376 |
| 6,307,413 B1 * | 10/2001 | Dalmia et al. | 327/166 |
| 6,310,521 B1 * | 10/2001 | Dalmia | 331/11 |
| 6,347,128 B1 * | 2/2002 | Ransijn | 375/376 |
| 6,351,508 B1 * | 2/2002 | Shishkoff et al. | 375/375 |
| 6,366,135 B1 * | 4/2002 | Dalmia et al. | 327/12 |
| 6,535,527 B1 * | 3/2003 | Duffy | 370/509 |

OTHER PUBLICATIONS

A 1Gb/s CMOS Clock and Data Recovery Circuit, by Hui Wang and Richard Nottenburg, 1999 IEEE International Solid–State Circuits Conference, Feb. 17, 1999, pp. 354–355.

Kamal Dalmia et al., Data Frequency Detector, Serial No. 09/471,915, Filed Dec. 23, 1999.

Kamal Dalmia, Reference–Free Clock Generator and Data Recovery, Serial No. 09/471,914, Filed Dec. 23, 1999.

Kamal Dalmia, Reference–Free Clock Generator and Data Recovery PLL, Serial No. 09/471,576, Filed Dec. 23, 1999.

\* cited by examiner

*Primary Examiner*—Stephen Chin
*Assistant Examiner*—Lawrence Williams
(74) *Attorney, Agent, or Firm*—Christopher P. Maiorana, P.C.

(57) ABSTRACT

An apparatus comprising a first circuit, a second circuit and a logic circuit. The first circuit may be configured to generate a first output signal having a first data rate in response to an input signal having a second data rate and clock signal having the second data rate. The second circuit may be configured to generate a second output signal in response to the input signal and the clock signal. The logic circuit may be configured to generate a clock signal in response to the first output signal and the second output signal.

21 Claims, 5 Drawing Sheets

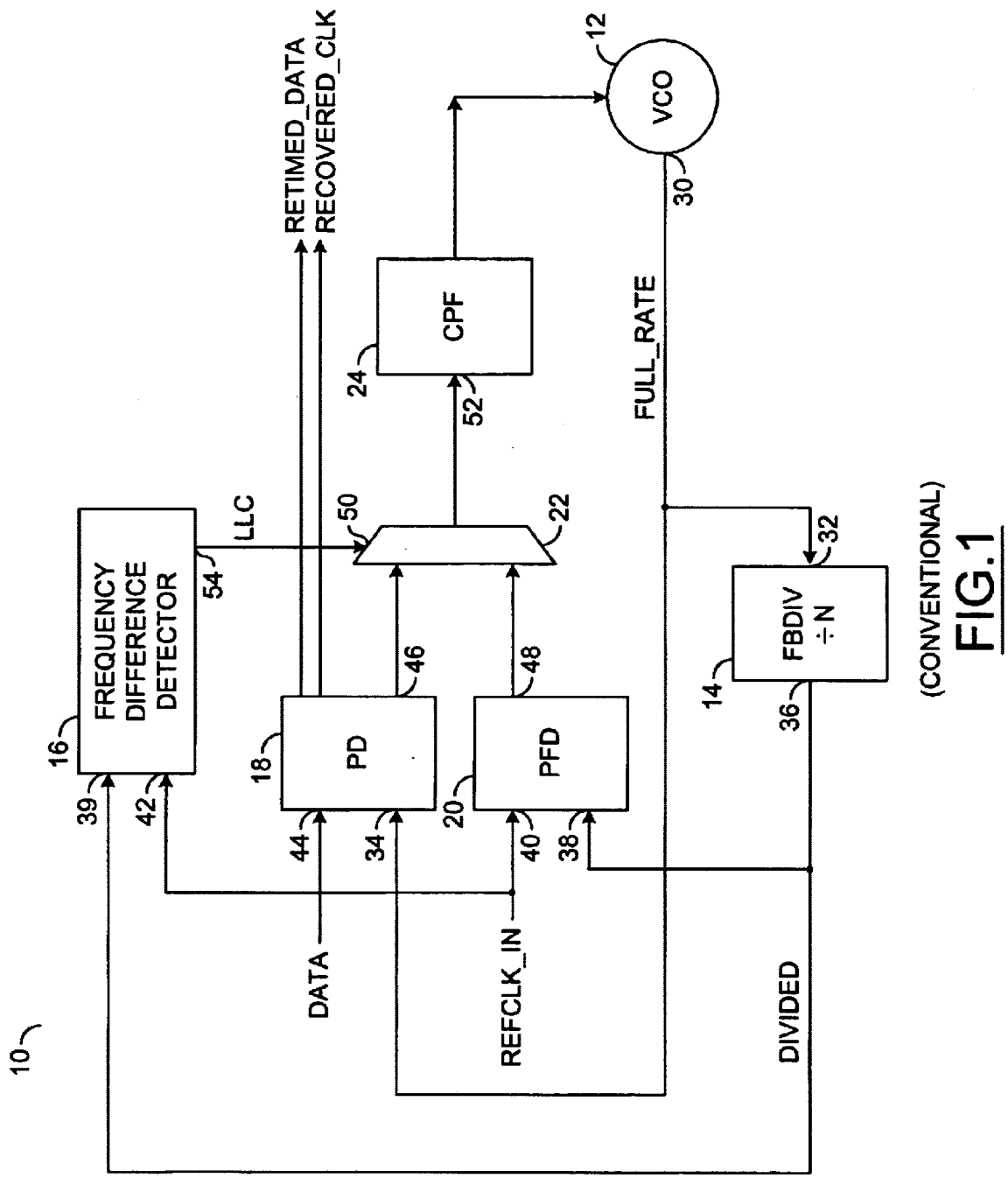
FIG.1 (CONVENTIONAL)

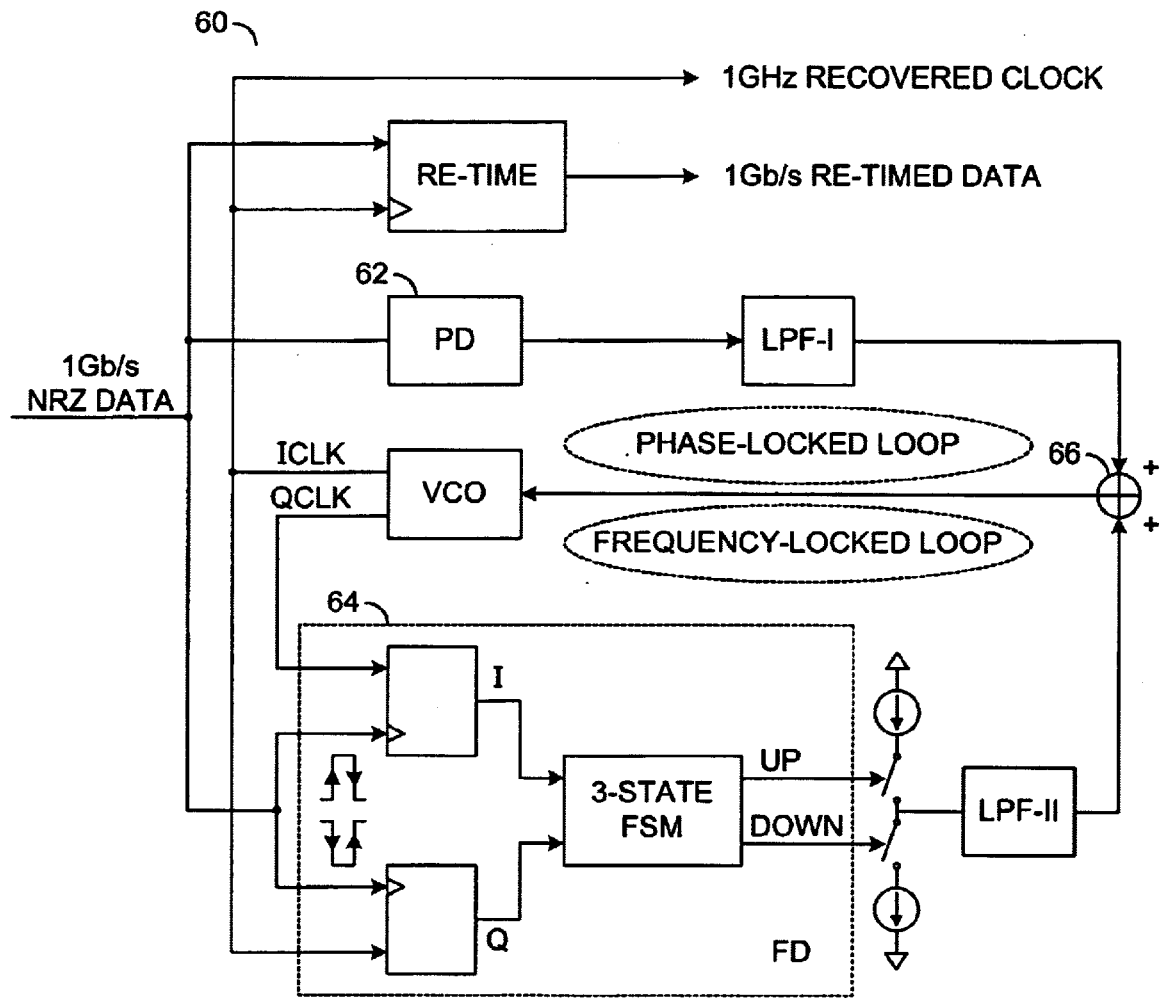
(CONVENTIONAL)
FIG.2

DIGITAL PHASE/FREQUENCY DETECTOR, AND CLOCK GENERATOR AND DATA RECOVERY PLL CONTAINING THE SAME

CROSS REFERENCE TO RELATED APPLICATIONS

The present application may relate to co-pending application Ser. No. 09/471,915, filed Dec. 23, 1999, now U.S. Pat. No. 6,366,135, Ser. No. 09/471,914, filed Dec. 23, 1999, now U.S. Pat. No. 6,307,413 and Ser. No. 09/471,576, filed Dec. 23, 1999, now U.S. Pat. No. 6,310,521 and each hereby incorporated by reference in their entirety.

FIELD OF THE INVENTION

The present invention relates to the recovery of clock signal(s) from a serial input data stream generally and, more particularly, to a method and/or architecture for a reference-less linear clock and data recovery phase-lock loop (PLL).

BACKGROUND OF THE INVENTION

Referring to FIG. 1 a conventional clock and data recovery circuit 10 implemented in a serial data communication device is shown. The circuit 10 comprises an VCO 12, a divider 14, a frequency difference detector (FDD) 16, a phase detector (PD) 18, a phase-frequency detector (PFD) 20, a multiplexer 22 and a charge pump filter (CPF) 24. The VCO 12 generates a full-rate clock signal (i.e., FULL_RATE) at an output 30. The clock signal FULL_RATE is presented to an input 32 of the divider 14 and to an input 34 of the phase detector 18. The clock signal FULL_RATE is divided (i.e., by an integer N), by the divider 14. The divider 14 presents a divided clock signal (i.e., DIVIDED) at an output 36. The clock signal DIVIDED is presented to an input 38 of the phase-frequency detector 20 and to an input 39 of the frequency difference detector 16.

The phase-frequency detector 20 also has an input 40 that receives a reference clock signal (i.e., REFCLK_IN). The phase-frequency detector 20 compares the clock signal REFCLK_IN and the clock signal DIVIDED. The clock signal REFCLK_IN is presented to an input 42 of the frequency difference detector 16. The phase detector 18 has an input 44 that receives a signal DATA. The signal DATA operates at a full rate. An output 46 of the phase detector 18 is connected to a first input of the multiplexer 22. An output 48 of the phase-frequency detector 20 is connected to a second input of the multiplexer 22. The signals presented at the outputs 46 and 48 are pump-up and pump-down signals.

The multiplexer 22 has an input 50 that receives a control signal LLC. The multiplexer 22 presents a multiplexed signal to an input 52 of the charge pump filter 24. The multiplexer 22 presents the multiplexed signal in response to the signal LLC. The frequency difference detector 16 presents the signal LLC at an output 54 in response to a comparison between the clock signal REFCLK_IN and the clock signal DIVIDED. If the frequency of the signal REFCLK and the signal DIVIDED are within a certain range, the frequency difference detector 16 toggles the signal LLC. The signal LLC controls (i) the "locking" of the PLL to the clock REFCLK_IN or (ii) the signal DATA. When the PLL is frequency locked to the clock signal REFCLK_IN, the multiplexer 22 is switched to select the rate of the signal DATA. The closed loop with the phase detector 18 then locks to the rate of the signal DATA and generates a signal RETIMED_DATA and a clock signal RECOVERD_CLK. The circuit 10 requires the implementation of the reference clock signal REFLCK_IN of the frequency difference detector 16.

Referring to FIG. 2, a conventional circuit 60 for performing clock and data recovery in a serial data communication device is shown. FIG. 3 illustrates a timing diagram of the circuit of FIG. 2. The circuit 60 implements an analog phase detector 62 and a digital frequency detector 64. The circuit 60 implements a full-rate clock CLK and corresponding quadrature Q for frequency detection (shown in FIG. 3). The circuit 60 implements dual loop filter design. The output of the phase detector 62 and the output of the frequency detector 64 are added together by the loop filter 66 (i.e., analog summing). The analog phase detector 62 is not robust in the presence of (i) data dependent jitter and/or (ii) missing data transitions. Hence, the circuit 60 provides a low overall jitter tolerance.

SUMMARY OF THE INVENTION

The present invention concerns an apparatus comprising a first circuit, a second circuit and a logic circuit. The first circuit may be configured generate a first output signal having a first data rate in response to an input signal having a second data rate and clock signal having the second data rate. The second circuit may be configured to generate a second output signal in response to the input signal and the clock signal. The logic circuit may be configured to generate a clock signal in response to the first output signal and the second output signal.

The objects, features and advantages of the present invention include providing a circuit and/or method that may (i) enable reference-less clock and data recovery, (ii) not require a clock difference detector, (iii) reduce overall circuit die size, (iv) reduce system cost, and/or (v) reduce power consumption.

BRIEF DESCRIPTION OF THE DRAWINGS

These and other objects, features and advantages of the present invention will be apparent from the following detailed description and the appended claims and drawings in which:

FIG. 1 is a block diagram of a conventional circuit for clock and data recovery;

FIG. 2 is a block diagram of another conventional circuit for clock and data recovery;

DETAILED DESCRIPTION OF THE PREFERRED EMBODIMENTS

Figure 3:
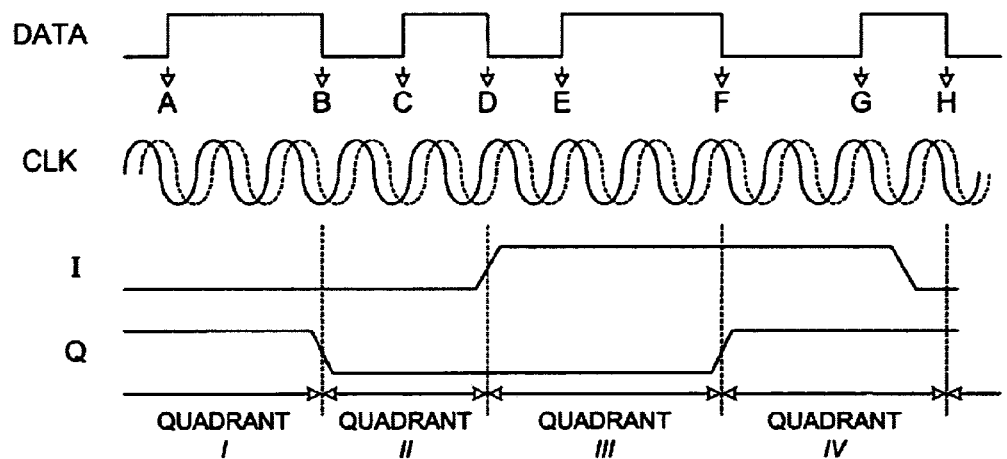
FIG. 3 is a timing diagram of the circuit of FIG. 2.
Figure 3:
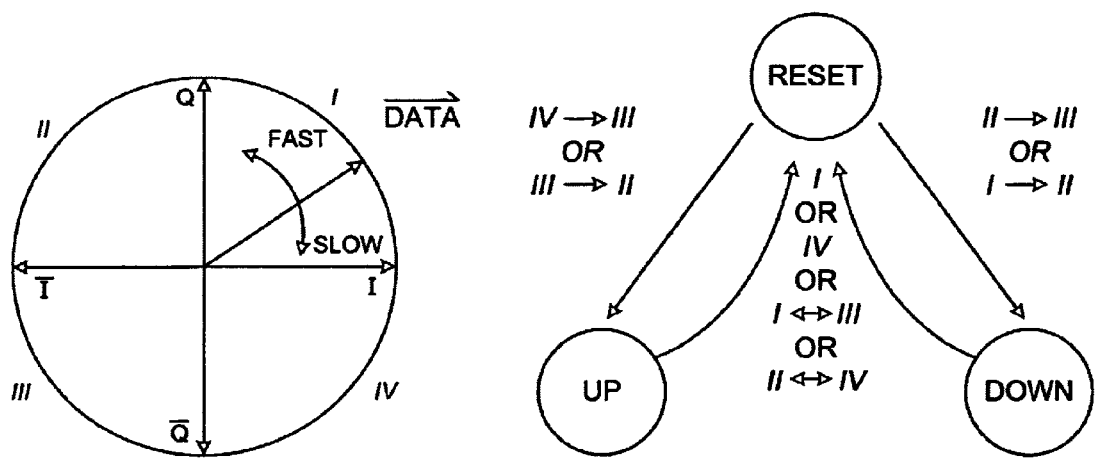
Figure 4:
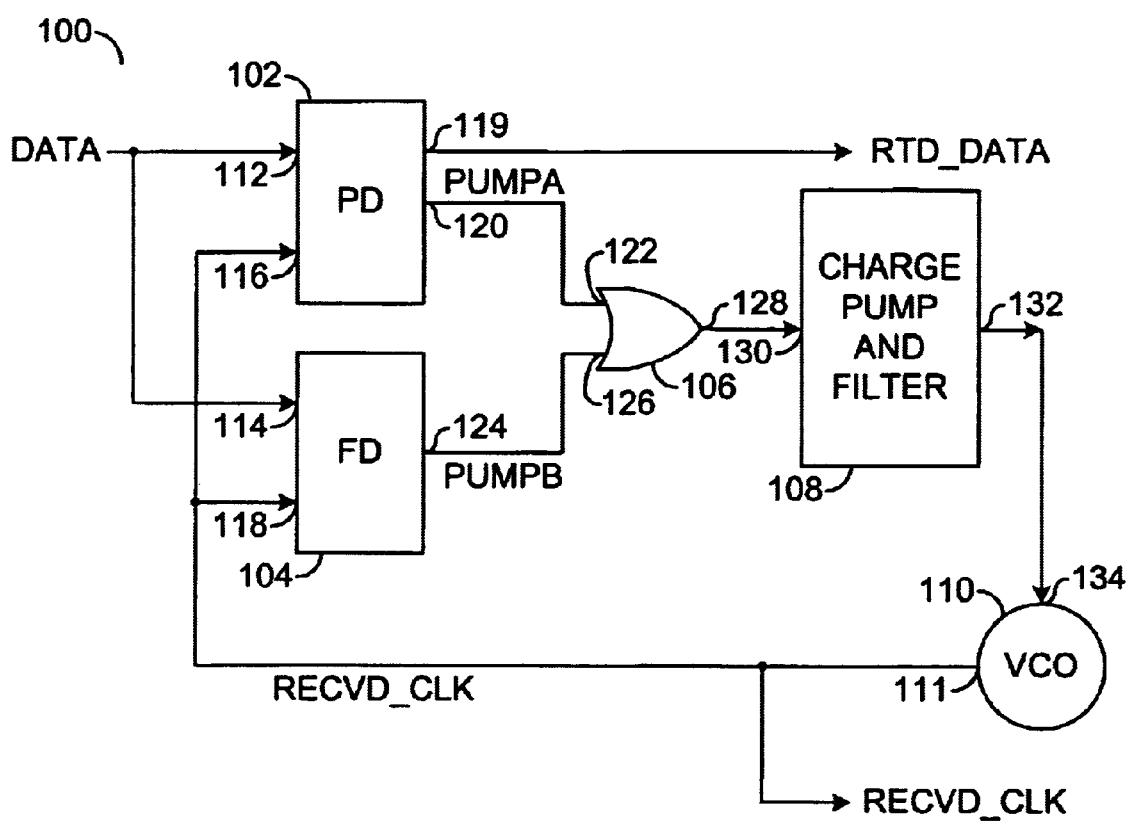
FIG. 4 is a block diagram of a preferred embodiment of the present invention.

Referring to FIG. 4, a block diagram of a circuit 100 is shown in accordance with a preferred embodiment of the present invention. The circuit 100 may be implemented as a clock and data recovery PLL with a reference-less digital frequency and digital phase detector. The circuit 100 may be further implemented as a PLL that may (i) generate digital frequencies and/or (ii) add phase and frequency detector outputs to generate a re-timed clock signal.

The circuit 100 may comprise a phase detector (PD) block (or circuit) 102 and a frequency detector (FD) block (or circuit) 104. The phase detector 102 and the frequency detector 104 may be implemented as a digital linear phase detector and a digital frequency detector, respectfully. The digital linear phase detector and the digital frequency detector, in one example, may be implemented in combination to form a reference-less digital dual loop architecture. The reference-less dual loop architecture may generate a referenced data signal and a recovered clock signal. The circuit 100 may further comprise a gate 106, a charge pump block (or circuit) 108 and a VCO block (or circuit) 110. The VCO block 110 may present a clock signal (e.g., RECVD_CLK) at an output 111. In one example, the gate 106 may be implemented as a digital OR gate. However, the gate 106 may be implemented as any type logic gate necessary to meet the design criteria of a particular implementation.

The phase detector 102 and the frequency detector 104 may each receive a signal (e.g., DATA) at an input 112 and 114, respectively. The signal DATA may operate at a first data rate. The phase detector 102 and the frequency detector 104 may each receive the clock signal RECVD_CLK at an input 116 and 118, respectfully. The phase detector 102 may be implemented, in one example, as a 2-phase detector. However, other phase detectors may be implemented to meet the design criteria of a particular implementation. In one example, the frequency detector 104 may be implemented as a single phase frequency detector. However, other phase frequency detectors may be implemented accordingly to meet the design criteria of a particular implementation. The clock signal RECVD_CLK may be implemented as a recovered clock signal, or any other type clock signal in order to meet the criteria of a particular implementation. The phase detector 102 may generate a signal (e.g., RTD_DATA) at an output 119. The signal RTD_DATA may be implemented as a re-timed data signal or any other type signal in order to meet the criteria of a particular implementation. The signal RTD_DATA may operate at a second data rate that may be the same or different data rate than the first data rate of the signal DATA.

The phase detector 102 may have an output 120 that may present a signal (e.g., PUMPA). The signal PUMPA may be presented to an input 122 of the gate 106 and may operate at the first data rate. The phase detector 102 may be configured to generate the signal PUMPA as a narrow pulse width signal. The frequency detector 104 may have an output 124 that may present a signal (e.g., PUMPB). The frequency detector 104 may be configured to generate the signal PUMPB as a wide pulse width signal. The signal PUMPB may operate at a third data rate that may be the same or different than the first data rate of the signal DATA and/or the second data rate of the signal RTD_DATA. The signal PUMPB may be presented to an input 126 of the gate 106. The signals PUMPA and a PUMPB may both be implemented as either pump-up signals, pump-down signals or a combination of pump-up and pump-down signals.

The signals PUMPA and PUMPB may be summed by the gate 106. The frequency detector 104 may generate the signal PUMPB having a constant width during frequency acquisition. The frequency detector 104 may not generate the signal PUMPB when the PLL is in a "lock" state with respect to the signal DATA. The frequency detector 104 may enable the gate 106.

During the frequency acquisition state, the signal PUMPB is generally wider than the signal PUMPA. This may prevent the signal PUMPA from overpowering the charge pump 108 and may bring the circuit 100 to the frequency locked state. Once in the frequency locked state, the frequency detector 104 may stop generating the signal PUMPB. When in the frequency locked state, the phase detector 102 may become the sole controller of the PLL loop. Hence, when the circuit is in the locked state (e.g., locked to the signal DATA), the loop is not affected by the frequency detector 104.

The gate 106 may have an output 128 that may present a logic signal to an input 130 of the charge pump 108. The charge pump 108 may be implemented to include both a charge pump and a filter. The charge pump 108 may have an output 132 that may present a signal having a frequency. The VCO 110 may have an input 134 that may receive the signal from output 132 of the charge pump 108. The VCO 110 may generate the signal RECVD_CLK in response to the signal received at the input 134. The VCO 110 may be implemented to operate within a narrow range (to be described in more detail in connection with FIG. 6).

Referring to FIG. 4 a state diagram illustrating the operation of the frequency detector 104 is shown. An example implementation of the frequency detector 104 may be found in co-pending application, Ser. No. 09/471,915, filed Dec. 23, 1999, now U.S. Pat. No. 6,366,135. The state machine of the frequency detector 104 is reproduced here for clarity. The frequency detector 104 may work with the signal DATA and the signal RECVD_CLK and generally does not require an external reference clock.

Figure 5:
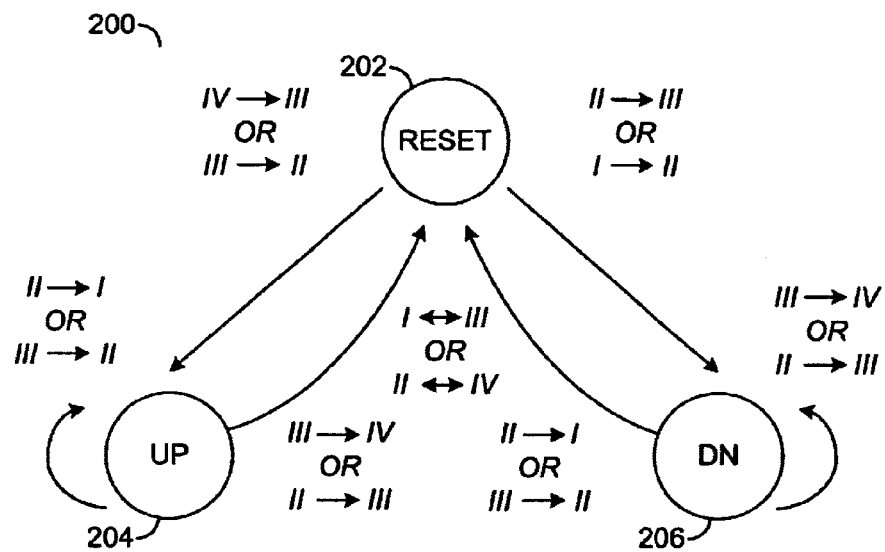
FIG. 5 is a state diagram illustrating the operation of the frequency detector of FIG. 4.

Referring to FIG. 5, a state diagram (or state machine) 200 is shown in accordance with a preferred embodiment of the present invention. The state diagram 200 generally comprises a "reset" state 202, an "up" state 204 and a "down" state 206. The state machine 200 may respond to a previous state as well as a current transition. For example, a transition between the quadrant III to the quadrant II may (i) cause a transition to the up state 204 if the state machine is in the reset state 202, (ii) remain in the up state 204 if the state machine 200 is in the up state 204 or (iii) cause a transition to the reset state 202 if the state machine 200 is in the down state 206. Other transitions have similar multiple responses.

As illustrated, the next state of the state machine 200 generally depends upon the previous state for each transition between two consecutive quadrants. The state machine 200 may generate every valid up and down transition signal. The state machine 200 may be used to improve lock time when implemented in a frequency detector. A transition of the signal DATA may (i) sample the signal CLK and QCLK (ii) respond with the appropriate action (e.g., either a transition to a new state or remain in the current state).

The state machine 200 may provide an improvement in jitter tolerance by allowing transitions between quadrants II and III. The state machine 200 may be used in clock and data recovery PLL designs that may operate at Gigabit/sec (and higher) data rates. The state machine 200 may enable (i) the implementation of a clock recovery PLL with no reference clock, (ii) improved lock range and (iii) improved lock time.

Figure 6:
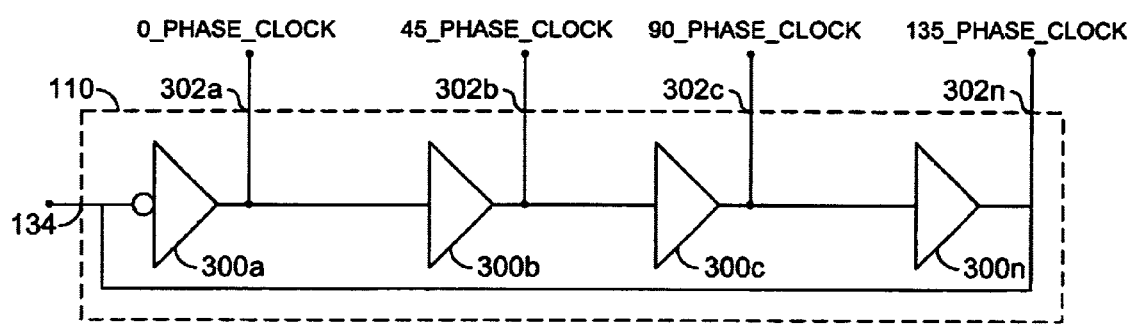
FIG. 6 is a detailed block diagram of a VCO of FIG. 4.

Referring to FIG. 6 a block diagram of the VCO 110 is shown. The VCO 110 may comprise a number of inverters (or buffers) 300a–300n. The inverter 300a may have an output 302a that may present a signal (e.g., 0_PHASE_CLOCK). The signal 0_PHASE_CLOCK may also be presented to the inverter 300b. The inverter 300b may have an output 302b that may present a signal (e.g., 45_PHASE_CLOCK) in response to the signal 0_PHASE_CLOCK. The signal 45_PHASE_CLOCK may also be presented to the inverter 300c. The inverter 300c may have an output 302c that may present a signal (e.g., 90_PHASE_CLOCK) in response to the signal 45_PHASE_CLOCK. The signal 90_PHASE_CLOCK may also be presented to the inverter 300n. The inverter 300n may have an output 302n that may present a signal (e.g., 135_PHASE_CLOCK) in response to the signal 90_PHASE_CLOCK. The signal 135_PHASE_CLOCK may also be presented to the inverter 300a. The inverter 300a may generate the signal 0_PHASE_CLOCK in response to the signal 135_PHASE_CLOCK.

Each of the signals 0_PHASE_CLOCK, 45_PHASE_CLOCK, 90_PHASE_CLOCK and 135_PHASE_CLOCK may be presented as the signal RECVD_CLK at the output 111 of the VCO 110. The VCO 110 may be implemented, in one example, to generate half-rate quadrature clocks. In one example, the VCO 110 may be implemented as a classic ring oscillator VCO. However, the VCO 110 may be implemented as any type VCO in order to meet the criteria of a particular implementation.

The circuit 100 may enable reference-less clock and data recovery. The circuit 100 may provide clock and data recovery without a reference clock generator, such as a crystal oscillator. The absence of the reference clock generator may reduce overall system cost. The circuit 100 may also be implemented without a clock difference detector. The absence of the clock difference detector may further reduce die area and/or system cost.

While the invention has been particularly shown and described with reference to the preferred embodiments thereof, it will be understood by those skilled in the art that various changes in form and details may be made without departing from the spirit and scope of the invention.

What is claimed is:

1. An apparatus comprising:
    a phase detector circuit configured to generate a first output signal having a first data rate in response to (i) a data input signal having a second data rate and (ii) a clock signal having said second data rate;
    a frequency detector circuit configured to generate a second output signal having a third data rate in response to (i) said data input signal and (ii) said clock signal; and
    a logic circuit configured to generate said clock signal in response to (i) said first output signal and (ii) said second output signal.

2. The apparatus according to claim 1, wherein said phase detector circuit is further configured to generate a first recovered data signal having said second data rate.

3. The apparatus according to claim 1, wherein said phase detector circuit comprises a digital linear phase detector and said frequency circuit comprises a digital frequency detector.

4. The apparatus according to claim 2, wherein said first data signal comprises a re-timed data signal.

5. The apparatus according to claim 1, wherein said clock signal comprises a recovered clock signal.

6. The apparatus according to claim 1, wherein said first data rate, said second data rate and said third data rate are the same data rate or a different data rate.

7. The apparatus according to claim 1, wherein said first and said second output signals are (i) both pump-up signals, (ii) both pump-down signals or (iii) a combination of pump-up and pump-down signals.

8. The apparatus according to claim 5, wherein (i) said first output signal and/or (ii) said second output signal is configured to control said logic circuit.

9. The apparatus according to claim 7, wherein said logic circuit comprises (i) a gate, (ii) a charge pump and filter circuit and (iii) a VCO, wherein said gate is configured to receive said first and second signals.

10. The apparatus according to claim 9, wherein said charge pump and said filter circuit are configured to control said VCO in response to said gate, wherein said VCO is configured to generate said clock signal.

11. The apparatus according to claim 9, wherein said gate (i) comprises a digital OR gate and (ii) is configured to digitally combine said first and second signals.

12. The apparatus according to claim 11, wherein said apparatus comprises a reference-less dual loop clock and data architecture.

13. An apparatus comprising:
    means for using a phase detector for generating a first output signal having a first data rate in response to (i) a data input signal having a second data rate and (ii) a clock signal having said second data rate;
    means for using a frequency detector for generating a second output signal having a third data rate in response to (i) said data input signal and (ii) said clock signal; and
    means for generating said clock signal in response to (i) said first output signal and (ii) said second output signal.

14. A method for clock data recovery comprising the steps of:
    (A) using a phase detector for generating a first output signal having a first data rate in response to (i) data input signal having a second data rate and (ii) a clock signal having said second data rate;
    (B) using a frequency detector for generating a second output signal having a third data rate in response to (i) said data input signal and (ii) said clock signal; and
    (C) generating said clock signal in response to (i) said first output signal and (ii) said second output signal.

15. The method according to claim 14, wherein step (A) further comprises the sub-step of:
    (A-1) generating a first data signal having said second data rate.

16. The method according to claim 15, wherein said first data signal comprises a re-timed data signal.

17. The method according to claim 14, wherein said clock signal comprises a recovered clock signal.

18. The method according to claim 14, wherein said first and second output signals are (i) both pump-up signals, (ii) both pump-down signals or (iii) a combination of pump-up and pump-down signals.

19. The method according to claim 14, wherein (i) said first and/or (ii) said second signal controls the generation of said clock signal.

20. The method according to claim 14, wherein said step (C) further comprises adding said first and second output signals.

21. The apparatus according to claim 1, wherein said apparatus comprises a reference-less dual loop clock and data architecture.

* * * * *